United States Patent
Reddy et al.

(10) Patent No.: US 9,535,614 B2
(45) Date of Patent: Jan. 3, 2017

(54) TEMPERATURE BASED FLASH MEMORY SYSTEM MAINTENANCE

(71) Applicant: SanDisk Technologies Inc., Plano, TX (US)

(72) Inventors: Gautham Reddy, San Jose, CA (US); Nian Niles Yang, Mountain View, CA (US); Alexandra Bauche, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 251 days.

(21) Appl. No.: 14/086,355

(22) Filed: Nov. 21, 2013

(65) Prior Publication Data

US 2015/0143026 A1    May 21, 2015

(51) Int. Cl.
*G06F 3/06* (2006.01)
*G11C 7/04* (2006.01)
*G11C 11/56* (2006.01)
*G11C 16/34* (2006.01)

(52) U.S. Cl.
CPC ............ *G06F 3/0616* (2013.01); *G06F 3/064* (2013.01); *G06F 3/0679* (2013.01); *G11C 7/04* (2013.01); *G11C 11/5621* (2013.01); *G11C 16/349* (2013.01); *G11C 16/3418* (2013.01)

(58) Field of Classification Search
CPC ... G11C 7/04; G11C 11/5621; G11C 16/3418; G11C 16/349; G06F 3/0616; G06F 3/064; G06F 3/0679
See application file for complete search history.

(56) References Cited

U.S. PATENT DOCUMENTS

| 6,801,454 | B2 | 10/2004 | Wang et al. | |
|---|---|---|---|---|
| 2008/0235466 | A1* | 9/2008 | Traister | G11C 16/10 711/154 |
| 2010/0058018 | A1* | 3/2010 | Kund | G11C 7/04 711/167 |
| 2011/0219203 | A1* | 9/2011 | Nurminen | G11C 7/04 711/165 |
| 2013/0159600 | A1 | 6/2013 | Dror et al. | |

OTHER PUBLICATIONS

International Search Report and Written Opinion of the International Searching Authority mailed Jan. 30, 2015 for PCT Application No. PCT/US2014/060469 (13 pp.).
International Preliminary Report on Patentability and Written Opinion of the International Searching Authority mailed May 24, 2016 for PCT Application No. PCT/US2014/060469 (13 pp.).

* cited by examiner

*Primary Examiner* — Alexander Sofocleous
*Assistant Examiner* — Alfredo Bermudez Lozada
(74) *Attorney, Agent, or Firm* — Brinks Gilson & Lione (57) ABSTRACT

A memory system or flash card may include memory maintenance scheduling that improves the endurance of memory. Certain parameters, such as temperature, are measured and used for scheduling maintenance. For example, memory maintenance may be performed or postponed depending on the ambient temperature of the card. The memory maintenance operations may be ranked or classified (e.g. in a memory maintenance queue based on priority) to correspond with threshold values of the parameters for a more efficient scheduling of memory maintenance. For example, at a low temperature threshold, only high priority maintenance operations are performed, while at a higher temperature threshold, any priority maintenance operation is performed.

13 Claims, 10 Drawing Sheets

TEMPERATURE BASED FLASH MEMORY SYSTEM MAINTENANCE

TECHNICAL FIELD

This application relates generally to memory devices. More specifically, this application relates to management and scheduling of background operations to improve the endurance and the lifetime of non-volatile semiconductor flash memory.

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device.

As the non-volatile memory cell scales to smaller dimensions with higher capacity per unit area, the cell endurance due to program and erase cycling, and disturbances (e.g. due to either read or program) may become more prominent. The defect level during the silicon process may become elevated as the cell dimension shrinks and process complexity increases. Accordingly, memory meeting high endurance requirements may be more difficult, which may further increase research and development costs for the technology scaling.

Memory undergoes write/erase cycles due to both host writes and non-host writes. Non-host writes may include memory maintenance and/or background operations performed by/on the memory card. The memory recycling due to this memory maintenance may significantly reduce the card life. Memory maintenance may be performed whenever there is idle time and certain solutions attempt to reduce the number of write/erase cycles due to memory maintenance.

SUMMARY

It may be desirable to improve the endurance of memory through an optimized memory maintenance system that monitors certain parameters and schedules maintenance based on the values of those parameters. For example, temperature may be an exemplary parameter which is monitored. Memory maintenance may be performed or postponed depending on the ambient temperature of the card. The memory maintenance operations and background operations may be ranked or classified (e.g. in a memory maintenance queue based on priority) to correspond with threshold values of the parameters for a more efficient scheduling of memory maintenance. For example, at a low temperature threshold, only high priority maintenance operations are performed, while at a higher temperature threshold, any priority maintenance operation is performed.

BRIEF DESCRIPTION OF THE PRESENTLY PREFERRED EMBODIMENTS

Figure 1:
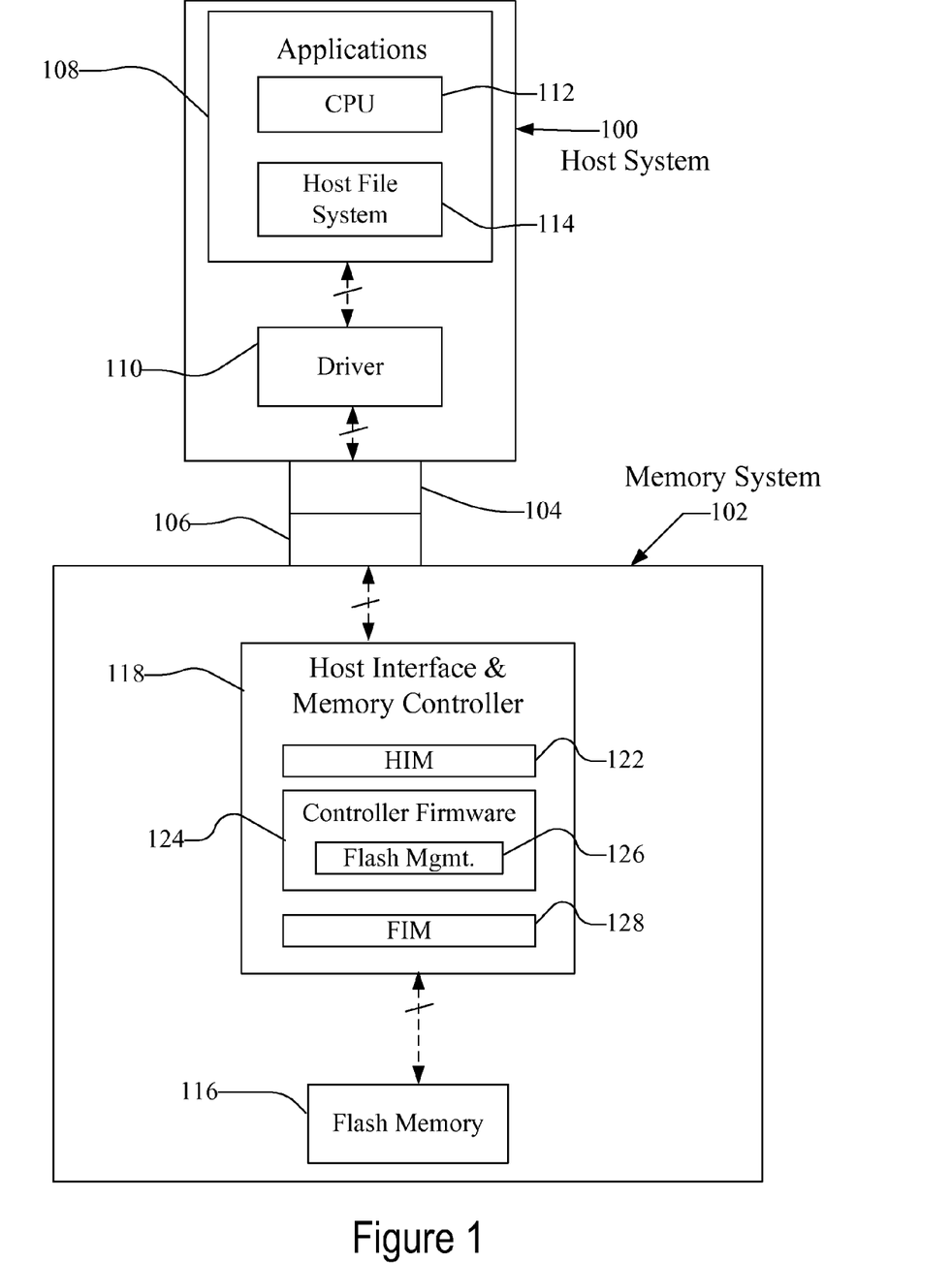
FIG. 1 is a block diagram of a host connected with a memory system having non-volatile memory.

A flash memory system suitable for use in implementing aspects of the invention is shown in FIGS. 1-6. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the Multi-MediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module 128. Flash management logic 126 may be part of the controller firmware 214 for internal memory management operations such as garbage collection. One or more flash interface modules (FIMs) 128 may provide a communication interface between the controller with the flash memory 116.

Figure 8:
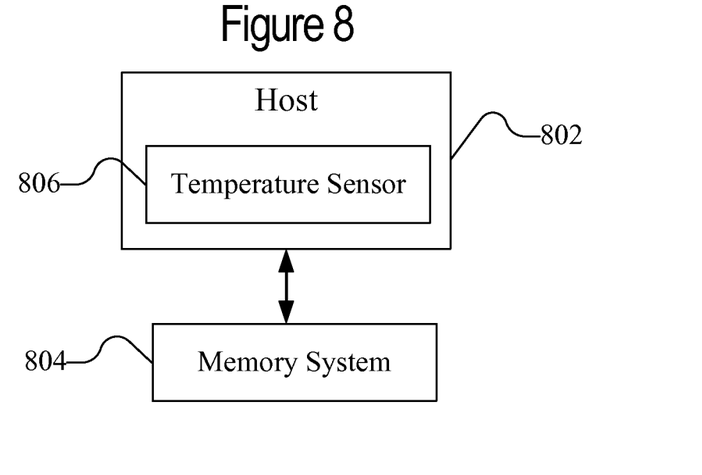
FIG. 8 is one embodiment of a temperature sensor with the host.
Figure 9:
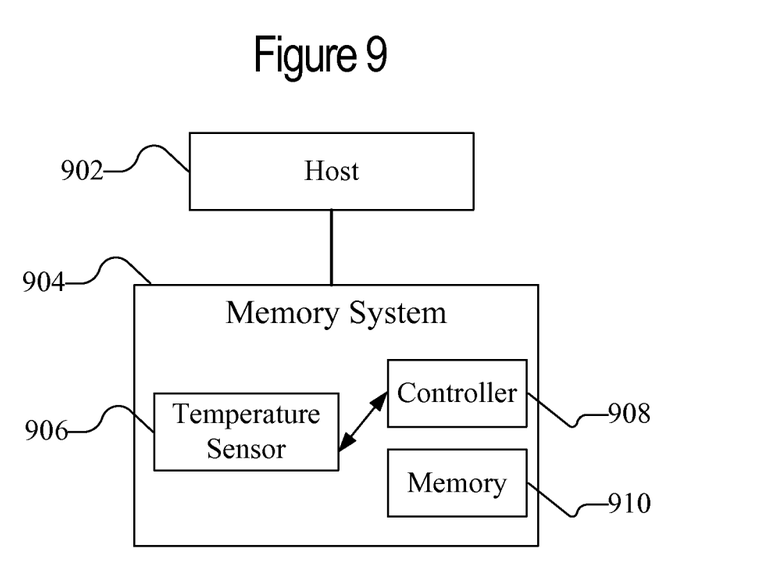
FIG. 9 is one embodiment of a temperature sensor with the memory system.

A flash transformation layer ("FTL") or media management layer ("MML") may be integrated in the flash management 126 and may handle flash errors and interfacing with the host. In particular, flash management 126 is part of controller firmware 124 and MML may be a module in flash management. The MML may be responsible for the internals of NAND management. In particular, the MML may include an algorithm in the memory device firmware which translates writes from the host 100 into writes to the flash memory 116. The MML may be needed because: 1) the flash memory may have limited endurance; 2) the flash memory 116 may only be written in multiples of pages; and/or 3) the flash memory 116 may not be written unless it is erased as a block. The MML understands these potential limitations of the flash memory 116 which may not be visible to the host 100. Accordingly, the MML attempts to translate the writes from host 100 into writes into the flash memory 116. As described below, the memory maintenance scheduling algorithm may be operated from the MML. The flash memory 116 or other memory may be multi-level cell (MLC) or single-level cell (SLC) memory. MLC and SLC memory are further described below. Either SLC or MLC may be included as part of the device controller 118 rather than as part of the flash memory 116. As illustrated in FIGS. 8-9, there may be a temperature sensor that is part of the host system 100 or part of the memory system 102.

Figure 2:
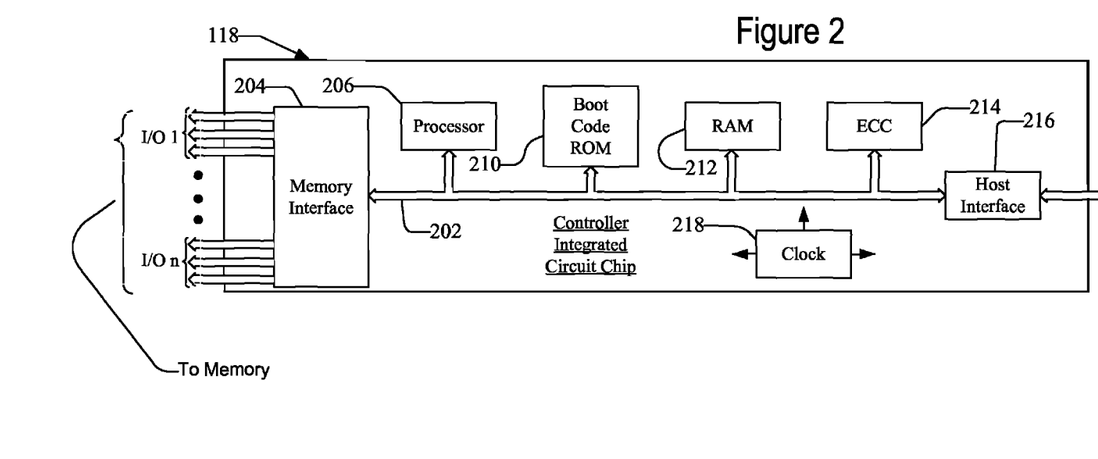
FIG. 2 is a block diagram of an exemplary flash memory device controller for use in the system of FIG. 1.

The device controller 118 may be implemented on a single integrated circuit chip, such as an application specific integrated circuit (ASIC) such as shown in FIG. 2. The processor 206 of the device controller 118 may be configured as a multi-thread processor capable of communicating via a memory interface 204 having I/O ports for each memory bank in the flash memory 116. The device controller 118 may include an internal clock 218. The processor 206 communicates with an error correction code (ECC) module 214, a RAM buffer 212, a host interface 216, and boot code ROM 210 via an internal data bus 202.

The host interface 216 may provide the data connection with the host. The memory interface 204 may be one or more FIMs 128 from FIG. 1. The memory interface 204 allows the device controller 118 to communicate with the flash memory 116. The RAM 212 may be a static random-access memory (SRAM). The ROM 210 may be used to initialize a memory system 102, such as a flash memory device. The memory system 102 that is initialized may be referred to as a card. The ROM 210 in FIG. 2 may be a region of read only memory whose purpose is to provide boot code to the RAM for processing a program, such as the initialization and booting of the memory system 102. The ROM may be present in the ASIC rather than the flash memory chip.

Figure 3:
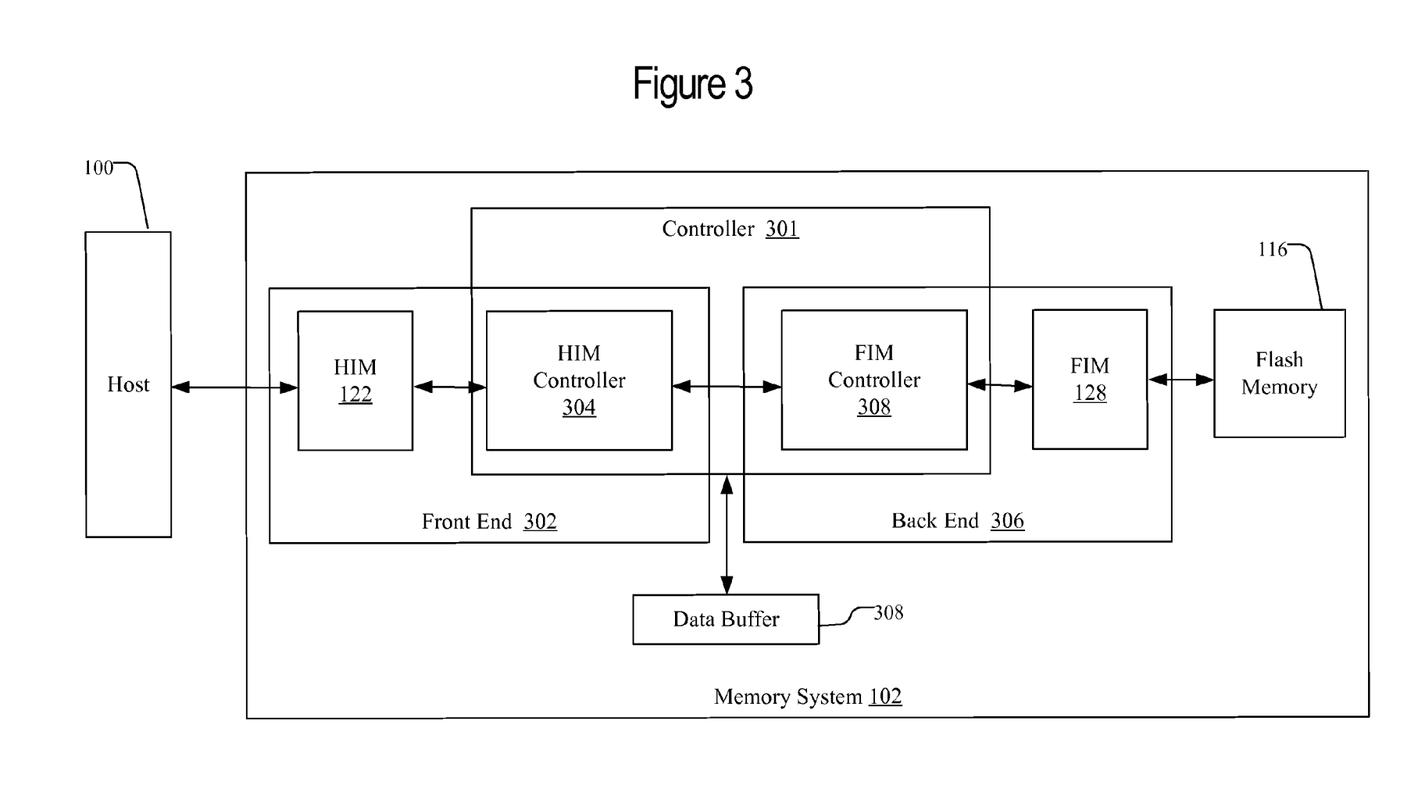
FIG. 3 is a block diagram of an alternative memory communication system.

FIG. 3 is a block diagram of an alternative memory communication system. The host system 100 is in communication with the memory system 102 as discussed with respect to FIG. 1. The memory system 102 includes a front end 302 and a back end 306 coupled with the flash memory 116. In one embodiment, the front end 302 and the back end 306 may be referred to as the memory controller and may be part of the device controller 118. The front end 302 may logically include a Host Interface Module (HIM) 122 and a HIM controller 304. The back end 306 may logically include a Flash Interface Module (FIM) 128 and a FIM controller 308. Accordingly, the controller 301 may be logically portioned into two modules, the HIM controller 304 and the FIM controller 308. The HIM 122 provides interface functionality for the host device 100, and the FIM 128 provides interface functionality for the flash memory 116. The controller 301 may be coupled with a temperature sensor 310. The temperature sensor 310 may be part of the host system 100 or part of the memory system 102 as illustrated in FIGS. 8-9. The temperature sensor may be located within either the controller 301, or stand-alone. In either embodiment, the accuracy of the temperature sensing may be improved the closer it is to the flash memory 116. The temperature sensor 310 communicates the measured/monitored temperature with the controller 301. The FIM controller 308 may include the algorithms implementing the learning phase and implementation phase as described below with respect to FIGS. 7-10.

In operation, data is received from the HIM 122 by the HIM controller 304 during a write operation of host device 100 on the memory system 102. The HIM controller 304 may pass control of data received to the FIM controller 308, which may include the FTL discussed above. The FIM controller 308 may determine how the received data is to be written onto the flash memory 116 optimally. The received data may be provided to the FIM 128 by the FIM controller 308 for writing data onto the flash memory 116 based on the determination made by the FIM controller 308. In particular, depending on the categorization of the data it may be written differently (e.g. to MLC or retained in an update block).

Figure 4:
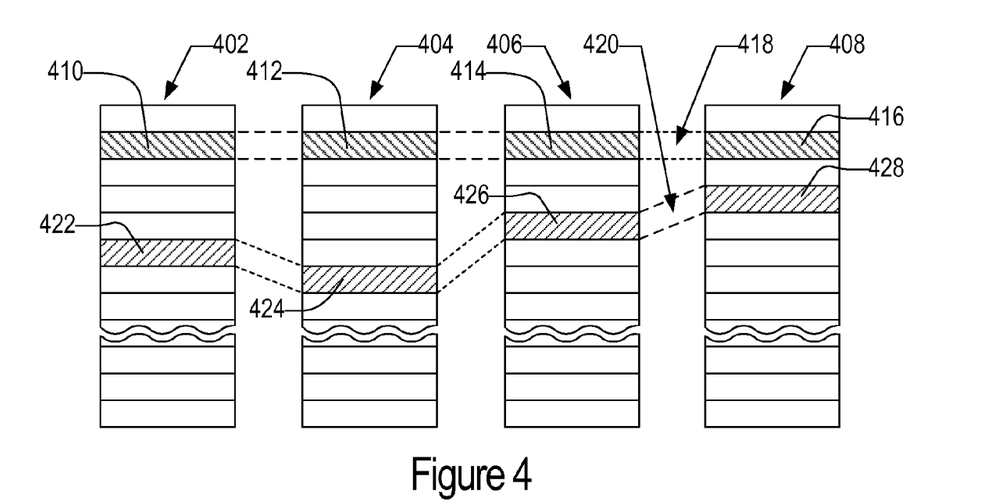
FIG. 4 is an example physical memory organization of the system of FIG. 1.

FIG. 4 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 402, 404, 406, and 408 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 4 by rectangles, such as blocks 410, 412, 414, and 416, located in respective planes 402, 404, 406, and 408. There can be any number of blocks in each plane.

The block of memory cells is the unit of erase, and the smallest number of memory cells that are physically erasable together. For increased parallelism, however, the blocks may be operated in larger metablock units. One block from each plane is logically linked together to form a metablock. The four blocks 410, 412, 414, and 416 are shown to form one metablock 418. All of the cells within a metablock are typically erased together. The blocks used to form a metablock need not be restricted to the same relative locations within their respective planes, as is shown in a second metablock 420 made up of blocks 422, 424, 426, and 428. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 5:
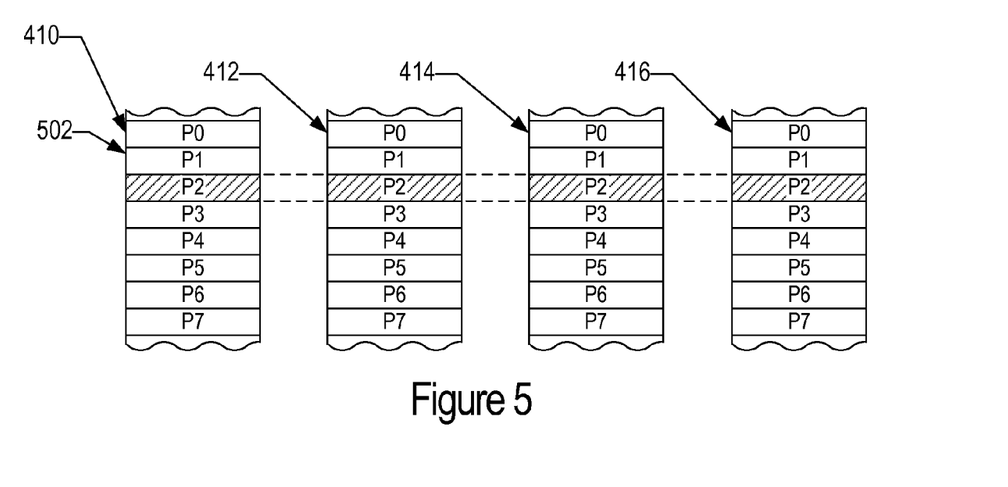
FIG. 5 is an expanded view of a portion of the physical memory of FIG. 4.

The individual blocks are in turn divided for operational purposes into pages of memory cells, as illustrated in FIG. 5. The memory cells of each of the blocks 410, 412, 414, and 416, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 502 is illustrated in FIG. 4, being formed of one physical page from each of the four blocks 410, 412, 414, and 416. The metapage 502, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material. As described below, SLC and MLC may have different endurance requirements, so the scheduling of maintenance operations to reduce wear and reduce write amplification ("WA") may be more important depending on those endurance requirements.

In implementations of MLC memory operated to store two bits of data in each memory cell, each memory cell is configured to store four levels of charge corresponding to values of "11," "01," "00," and "10." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 6:
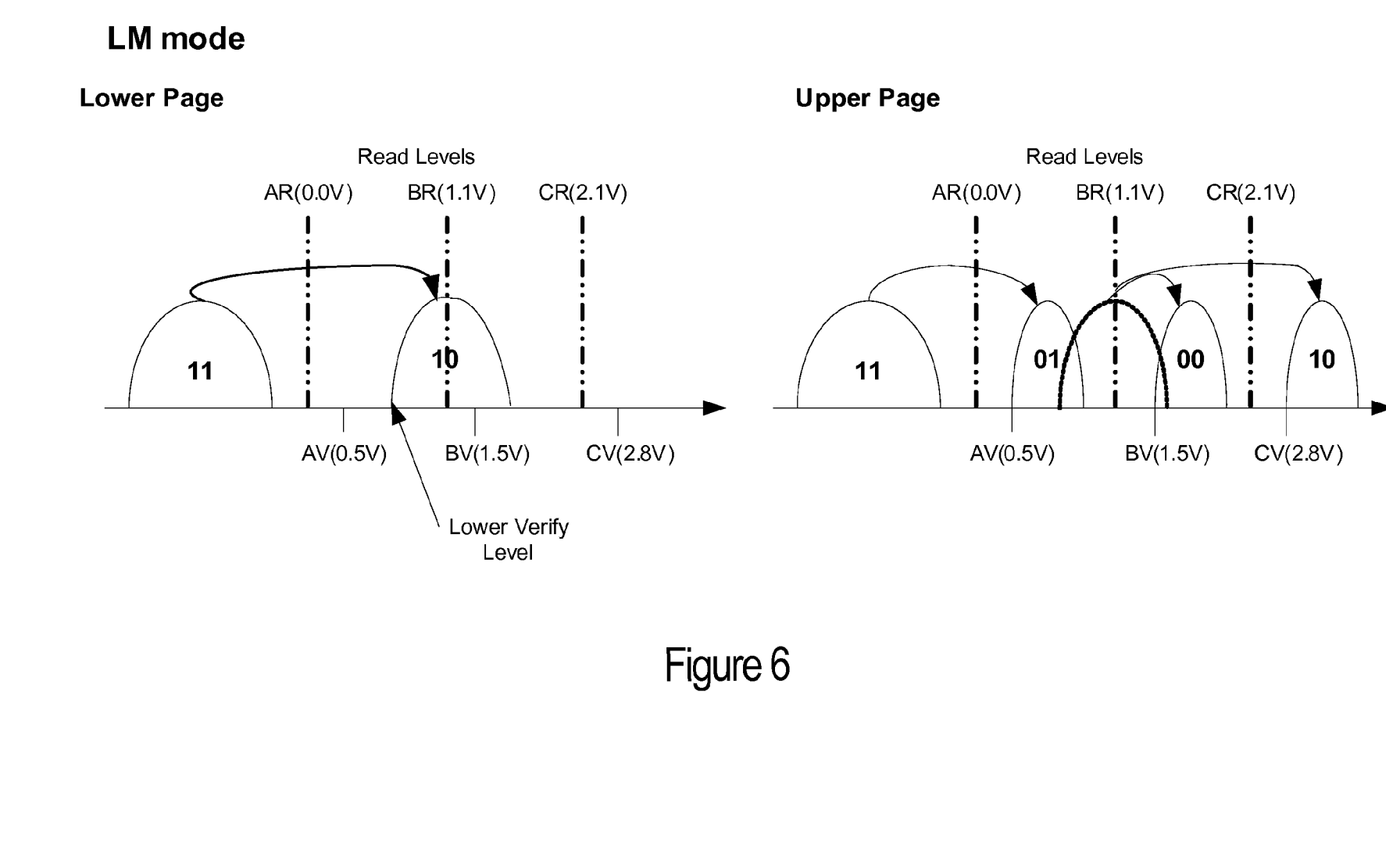
FIG. 6 is a diagram illustrating charge levels in a multi-level cell memory operated to store two bits of data in a memory cell.

FIG. 6 illustrates one implementation of the four charge levels used to represent two bits of data in a memory cell. FIG. 6 is labeled as LM mode which may be referred to as lower at middle mode and will further be described below regarding the lower at middle or lower-middle intermediate state. The LM intermediate state may also be referred to as a lower page programmed stage. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page. The lower page may be considered a logical concept that represents a location on a multi-level cell (MLC). If the MLC is two bits per cell, a logical page may include all the least significant bits of the cells on the wordline that are grouped together. In other words, the lower page is the least significant bits. For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Memory systems undergo write/erase operations due to both host writes and the memory maintenance operations in the normal life span of its application. The internal memory maintenance (i.e. non-host write operations or background operations) can introduce a high write amplification factor ("WAF") for both MLC and SLC. WAF may be the amount of data a flash controller has to write in relation to the amount of data that the host controller wants to write (due to any internal copying of data from one block to another block). In other words, WAF is the ratio of non-host write operations compared with writes from the host. In one example, up to half of the MLC write/erase operations may be due to these internal memory operations. This may have a significant effect on the life of the card. Accordingly, it may be important to reduce the endurance impact due to a system's internal write/erase operations. At higher temperatures, the defect generation in the memory cells due to the high voltage operations such as program and erase is slowed down, as compared with a lower temperature. The write amplification may not necessarily be lower, but the defects generated are reduced. At high temperature, the electrons have less probability to be trapped in the defects to create the chain reaction of generating more traps as discussed further with respect to FIG. 7. The tunnel oxide is thus able to maintain its integrity better at the higher temperatures. Reduced errors may eventually increase the average endurance of the device which is mentioned below with Table 1.

Memory maintenance (which is interchangeably referred to as non-host writes and/or background operations) may be performed only at optimal times. For example, memory maintenance may be limited depending on the temperature. One example of memory maintenance includes garbage collection which may be needed to aggregate obsolete data together in blocks to be erased. Garbage collection can group together valid data and group obsolete data. When a block includes only obsolete data, it can be erased so that new data can be written to that block. Garbage collection is used to maximize storage in blocks by minimizing the number of partially used blocks. In other words, garbage collection may be a consolidation or aggregation of valid data from blocks that have a mixture valid data and obsolete data that results in more free blocks since there are fewer blocks that have a mixture of both valid and obsolete data.

Based at least partially on WAF and an estimated usage for a particular card, there may be certain endurance requirements for both SLC and MLC. For example, by comparing the evaluations of the usage of multiple smartphones for a 32 gigabyte (GB) SD card over a certain time period (e.g. three years) an endurance requirement can be determined that exceeds the maximum simulated usage patterns to prevent card failure. The following exemplary Table 1 illustrates the endurance requirements on the memory based on the exemplary simulations in Table 1 for the product to work without failing for a period of 3 years. Based on Table 1, the SLC endurance requirements for the 4 GB and 8 GB capacity are significantly higher than the 16 GB capacities.

TABLE 1

Endurance requirements on memory

|  | SLC Endurance Requirement | MLC Endurance Requirement |
| --- | --- | --- |
| 4 GB | 50 k | 3 k |
| 8 GB | 30 k | 3 k |
| 16 GB | 20 k | 3 k |
| >=32 GB | 10 k | 3 k |

The endurance requirements illustrated in Table 1 are merely exemplary and may change over time. In particular, the endurance requirements shown are merely examples for explaining endurance requirements and those values may be different for different devices. As the technology size continually decreases, the endurance may also decrease. Based on increasing usage and potentially decreasing endurance, the dynamic monitoring and updating of background operations as described below should be a way to reduce overall wear, reduce failure, and improve the lifetime of the memory. Finally, the dynamic scheduling based on a parameter (e.g. temperature) that is described below may also reduce power consumption, cost of production, and time to market.

Figure 7:
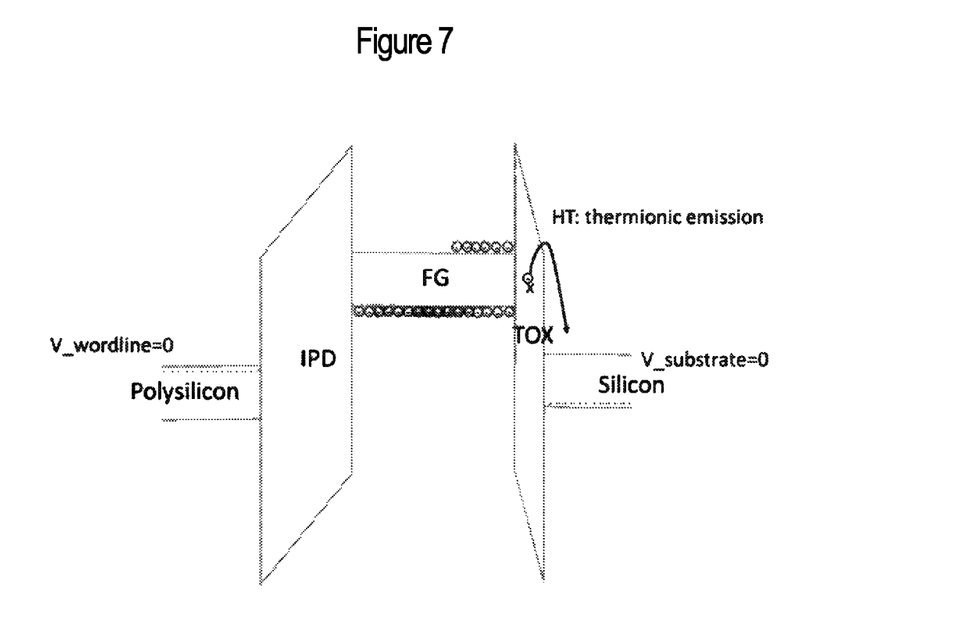
FIG. 7 illustrates de-trapping of trapped charge at high temperature ("HT") in the memory cell tunnel oxide.

FIG. 7 illustrates de-trapping of trapped charge at high temperature ("HT") in the memory cell tunnel oxide. FIG. 7 shows the energy band diagram of the de-trapping process of charge inside a memory cell's dielectrics such as oxide at high temperature ("HT"). As shown, IPD is inter-poly dielectrics, which may include silicon dioxide, silicon nitride, and silicon dioxide tri-layer. The floating gate ("FG") is a conductive layer to store the electrons. Polysilicon may be a control gate or wordline of the NAND cell, and silicon is the substrate on which the whole array of the NAND cells are built. The polysilicon may be the layer that is formed during the making of the cell, and the silicon is the existing wafer on which the NAND chips are made. Due to the thermionic emission, the electron trapped in the tunnel oxide ("TOX") can escape and thus create fewer traps (defects) in the oxide than otherwise for the case at lower temperature ("LT").

Accordingly, FIG. 7 illustrates why higher temperatures may result in fewer defects. At higher temperatures, the electrons have more energy to transition. Programming at higher temperature reduces the probability of errors during NAND usage. As described below, a monitored temperature can then be used as a trigger for determining when to perform memory maintenance. For example, a low temperature may mean that memory maintenance should be limited. Write/erase operations at higher temperature may introduce a lesser amount of the charge trapping in the memory cells causing fewer defects. Accordingly an algorithm may control memory maintenance based on thresholds for specific parameters based on the temperature to improve the memory endurance and card lifetime. The goal may be to maximize internal memory maintenance at higher temperatures.

FIG. 8 is one embodiment of a temperature sensor 806 with the host 802. The host 802 and memory system 804 may be the host or memory system illustrated in any of FIGS. 1-3, but are shown in FIG. 8 without additional elements for simplicity. FIG. 8 illustrates the temperature sensor 806 as part of the host 802. For example, if the host is a smartphone that receives a memory card (e.g. SD card), the smartphone may include a temperature sensor for monitoring the temperature. The host 802 can then communicate the measured temperature with the memory system 804 so that the memory system 804 can scheduled maintenance accordingly.

FIG. 9 is one embodiment of a temperature sensor 906 with the memory system 904. The host 902 and memory system 904 may be the host or memory system illustrated in any of FIGS. 1-3, but are shown in FIG. 9 without additional elements for simplicity. FIG. 9 illustrates the temperature sensor 906 as part of the memory system 904. In particular, the temperature sensor may be an internal component of the memory system. In one embodiment, the temperature sensor 906 is adjacent the memory 910 to measure the memory temperature accurately. The closer the temperature sensor 906 is to the memory 910, the more accurate the measurement will be. That measured temperature is communicated to the controller 908. The controller 908 can then schedule maintenance operations depending on the temperature.

In one embodiment, an analog to digital converter ("ADC") may be needed for the temperature sensor to measure and communicate the temperature information. The temperature sensor may be connected to a command controller, which may be separate from or a part of the memory controller.

The measured temperature information is then used to track and schedule memory maintenance activity. An algorithm may attempt to maximize the memory maintenance activity during a higher temperature, but reduce memory maintenance activity during a lower temperature.

Figure 10:
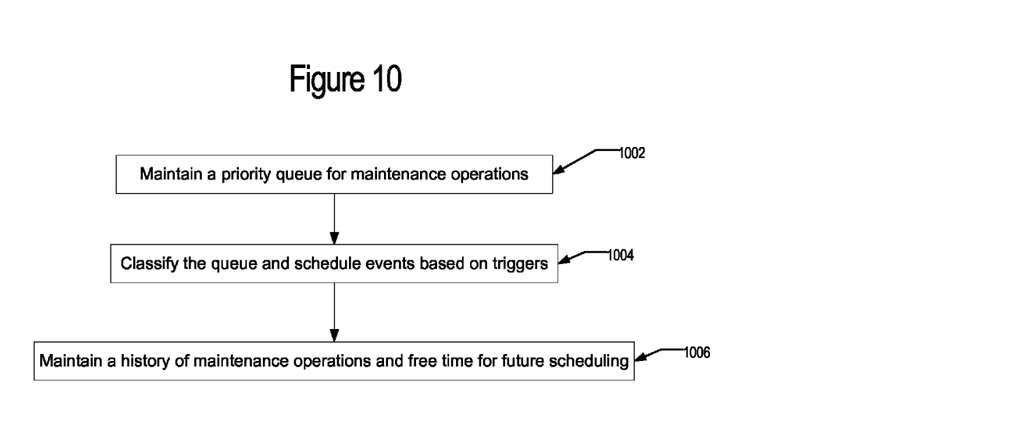
FIG. 10 is a flowchart illustrating simplified memory maintenance scheduling.

FIG. 10 is a diagram illustrating an algorithm for controlling memory maintenance. In block 1002, a maintenance queue is maintained based on a priority for each maintenance operation. As discussed above, maintenance operations may be initiated or run from the MML. One example of a maintenance operation is garbage collection. Additional MML requests that would be considered maintenance operations include: 1) binary cache compaction, 2) binary cache eviction, 3) MLC compaction, 4) control block compaction, 5) wear leveling, and/or 6) cluster folding.

The maintenance queue can be reordered or updated dynamically. In block 1004, the prioritized queue may be classified into regions and operations may be scheduled based on triggers for respective regions. Each maintenance operation can be classified (i.e. assigned a region) based on its priority. The general concept is for low priority maintenance operations to only run during idle time and at higher temperatures. The higher priority maintenance operations may need to be run regardless of the temperature.

Figure 11:
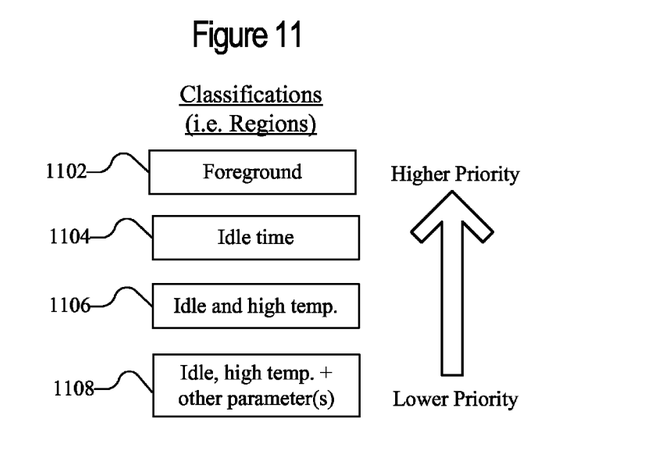
FIG. 11 illustrates exemplary classifications and the respective priorities for each classification.

FIG. 11 illustrates exemplary classifications and the respective priorities for each classification. The classification categories may also be referred to as regions. In particular, the classification illustrated in FIG. 11 is a classification for each maintenance operation. The highest priority maintenance operation is foreground 1102, which is a maintenance operation that runs in the foreground (i.e. without waiting for idle time). These highest priority maintenance operations may be performed by throttling the host. The second region with the next highest priority is idle time 1104. These maintenance operations are run during idle time. The third region with lower priority is both idle time and high temperature 1106. Maintenance operations that are lower priority will only be run during idle time and at a higher temperature. In other words, lower priority maintenance operations are not run during idle time, but may wait for a higher temperature at idle time. This can reduce errors by running more maintenance operations at higher temperatures. The fourth region may be optional and indicates an alternative parameter may be considered. The temperature is merely one example of a parameter considered for prioritizing maintenance operations and there may be additional examples. For example, the presence of a power supply may be another parameter to consider. In other words, lowest priority maintenance operations may only be run during idle time at higher temperatures, and when there is a power supply connected. Other exemplary parameters may include: 1) the fullness of the card; 2) the wear leveling factor of the block called hot count; 3) the frequency of the clock; and/or 4) the level of the VCC supply.

The classification system is designed such that maintenance operations (which may be referred to as events) should be performed during the appropriate classification. A region 1 event should not go to region 2, and a region 2 event should not go to region 3. In particular, the events targeted for a region should be completed during time available in that region. However, the transitions between regions is not a hard limit and some events may not be completed in their allocated region. For example, if it does not go into the region 1108 for few days, then the low priority events may become higher priority over time and be pushed to region 1106 or 1104 or 1102. A history of the amount of maintenance activity being generated for each region and the amount of free time found for each region are tracked. These two elements may be used to determine the boundaries of the regions. This way, we can, over time predict if a particular event can be handled in its allocated region and thus become more accurate in defining the region boundaries.

Figure 12:
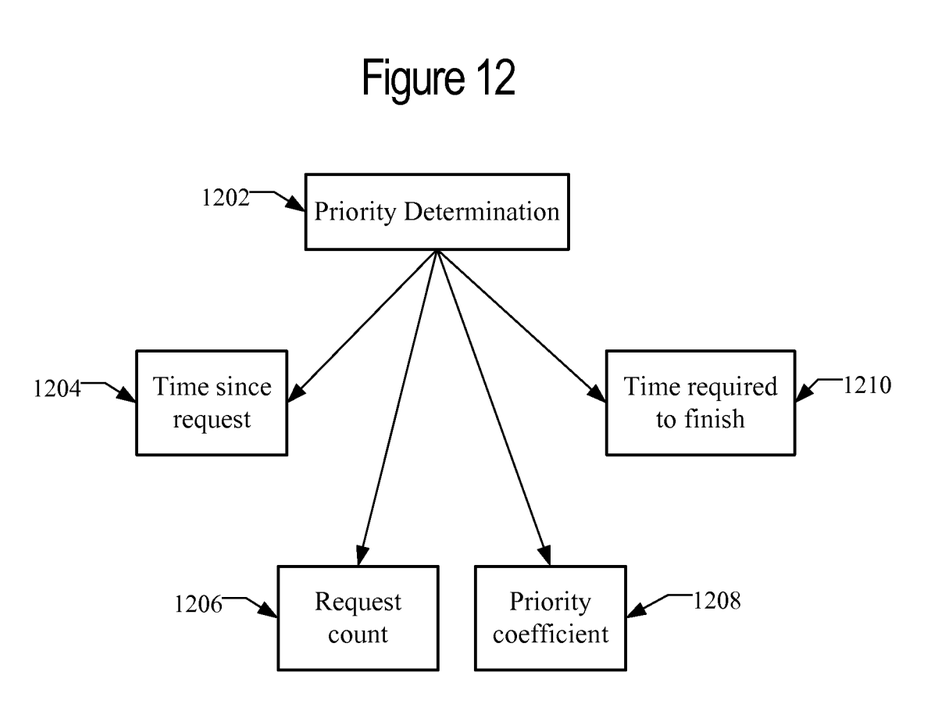
FIG. 12 illustrates exemplary priority determination 1202 factors.

Referring back to FIG. 10, in block 1006, a history of operation activity and free time available may be maintained and used for future scheduling decisions. The history of operation activity may include factors for priority determination illustrated in FIG. 12. FIG. 12 illustrates exemplary priority determination 1202 factors. The time since first request 1204 is a time counter that starts when a specific request is added to the queue. This signifies how long a specific maintenance operation has been pending in the queue. The request count 1206 is a count of the number of requests for one particular maintenance operation or event. Since the MML's request is processed based on priority, the MML may send more requests for specific operations based on the user activity even before the first one is handled. The priority coefficient 1208 is a value which may control the priority based on the history. Different garbage collection events may have different rate of change of priorities. For example, some events can be low priority for 1 month where as some events can be low priority for only few minutes. The events with faster rate of change are more likely to make the system go into urgent more and thereby throttling the host to do garbage collection in the foreground. In order to keep track of these types of events, there may be priority coefficient variable for each type of event. Every time an event is forced to be executed in the foreground, its priority may increases by one. This helps the system balance all the events accordingly. The time required to finish 1210 may be a further factor that is considered for priority.

The priority determination 1202 may be made based on any one or more of the factors illustrated in FIG. 12. In one embodiment, the priority may be calculated by the following formula:

$$\text{Priority} = (\text{time since first request}) * (\text{request count}) * (\text{priority coefficient}).$$

This formula may be used for each maintenance operation before adding it to the maintenance queue. The queue dynamically updates based on the priority values for the operations in the queue. Based on the assigned priorities for the operations in the queue may be further assigned to the regions/classifications illustrated in FIG. 11, which determined when those operations are scheduled. The scheduling is further illustrated in FIG. 13.

Figure 13:
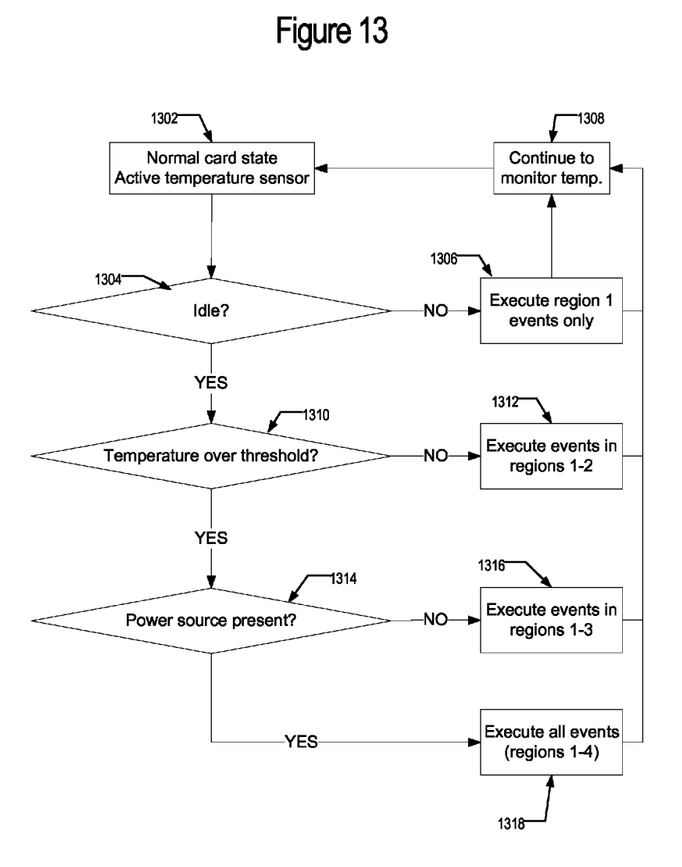
FIG. 13 illustrates one embodiment of scheduling of maintenance operations.

FIG. 13 illustrates one embodiment of scheduling of maintenance operations. In block 1302, the memory device (i.e. card) is in a normal state and the temperature sensor is active. In block 1304, a determination is made as to whether the card is idle or is actively processing host commands. If the card is not idle, then only region 1 maintenance operations can be executed as in block 1306. In other words, when the memory is not idle, only the highest priority maintenance operations are executed. When the card is idle as in block 1304, a determination is made as to the temperature in block 1310. In one embodiment, there may be a threshold temperature value that is determined. As further discussed below, there may be multiple thresholds with multiple priority values based on those thresholds; however, FIG. 13 illustrates the embodiment for a single temperature threshold. When the temperature is lower than the threshold temperature value, then maintenance operations in regions 1-2 are executed as in block 1312. Since the temperature is low, the lower priority maintenance operations (those in regions 3+) are not executed. When the temperature is over the threshold in block 1310, a determination is made as to whether a power source is present in block 1314. Power source presence is another exemplary parameter that may be used for scheduling maintenance operations. When no power source is present, then events from regions 1-3 are executed as in block 1316. Block 1316 illustrates idle time and a high temperature. In an alternative embodiment, there are only three regions and the only parameter that is analyzed is temperature. When the power source is present in block 1314, then all events can be executed in block 1318. Block 1318 is idle time, with a high temperature, and with a power source.

In alternative embodiments, the temperature measurement may be used for the priority measurement. As discussed above, the temperature was classified as either high or low (e.g. a binary state that is either above or below a threshold). However, there may be multiple thresholds. For example, there may be a determination of a low, medium, and high temperature state (two threshold temperatures). The maintenance operations to be performed may then be categorized into additional regions that consider the different temperature values. For example, there may be another classification or region in FIG. 11 that is idle and medium temperature. The classification attempts to perform the majority of the maintenance operations at higher temperatures and limit the maintenance operations at lower temperature. Only the higher priority maintenance operations may be run during lower temperatures. In alternative embodiments, there may be any number of temperature threshold values that are used for classifying maintenance operations and determining when those operations may be scheduled. The example in FIGS. 11-13 is for a single temperature threshold, but that is merely exemplary.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A flash memory device comprising:
   a non-volatile storage having an array of memory blocks storing data;
   a temperature sensor adjacent the non-volatile storage; and
   a controller in communication with the non-volatile storage and the temperature sensor, the controller is configured for:
      receiving a temperature value from the temperature sensor;
      generating a memory maintenance queue for memory maintenance operations to be performed with the non-volatile storage, wherein the operations are organized in the queue based on priority and the priority for each of the operations is based on at least one of a time since the operation was received, a time required to finish the operation, a number of times the operation was submitted, or a priority coefficient, wherein the priority coefficient is based on historical data of maintenance operations and wherein high priority operations are performed regardless of the temperature value; and
      performing low priority operations when the temperature value is above a temperature threshold and during idle time.

2. The device of claim 1 wherein the priority comprises a multiplication of the time since the operation was received and the number to times the operation was submitted and the priority coefficient.

3. The device of claim 1 wherein the historical data comprises a relative amount of maintenance activity.

4. A method for scheduling memory maintenance operations in a flash memory device comprising:
   in a non-volatile storage device having a controller and blocks of memory, the controller:
      receives a temperature value;
      generates a memory maintenance queue for the operations to be performed on the blocks of memory, wherein the operations are organized in the queue based on a priority, wherein the priority for each of the operations is based on at least one of a time since the operation was received, a time required to finish the operation, a number of times the operation was submitted, or a priority coefficient, further wherein the priority for each operation is based on a priority coefficient and a multiplication of time since the operation was received and number of times the operation was submitted;
      performs lower priority operations when the temperature value is above a temperature threshold and during idle time; and
      performs high priority operations regardless of the temperature value.

5. The method of claim 4 wherein the temperature value is an ambient temperature of the flash memory device.

6. The method of claim 4 wherein the temperature sensor is located at a host.

7. The method of claim 4 wherein the temperature sensor is located in the non-volatile storage device and communicates with the controller.

8. The method of claim 4 wherein the priority coefficient is based on historical data of maintenance operations.

9. A flash memory device comprising:
- a non-volatile storage having an array of memory blocks storing data;
- a temperature sensor adjacent the non-volatile storage; and
- a controller in communication with the non-volatile storage and the temperature sensor, the controller is configured to:
  - monitor idle time of the flash memory device;
  - monitor a temperature of the flash memory device from the temperature sensor; and
  - execute lower priority memory maintenance operations during the idle time and when the monitored temperature is above a temperature threshold, wherein the priority is determined based on a priority coefficient that reflects historical data of maintenance operations.

10. The flash memory device of claim 9 wherein the monitoring of the temperature comprises receiving a temperature from a temperature sensor.

11. The flash memory device of claim 10 wherein the flash memory device further comprises the temperature sensor coupled with the controller and configured to monitor the temperature and communicate the temperature to the controller.

12. The flash memory device of claim 9 wherein the controller is further configured to:
- execute higher priority maintenance operations regardless of the temperature.

13. The flash memory device of claim 9 wherein the controller is further configured to:
- receive an indication whether a power source is present; and
- execute lowest priority maintenance operations during the idle time and when the monitored temperature is above a temperature threshold and when the power source is present.

* * * * *